(12) United States Patent
Wakabayashi et al.

(10) Patent No.: US 10,906,756 B2
(45) Date of Patent: Feb. 2, 2021

(54) SUBSTRATE PROCESSING DEVICE

(71) Applicant: TOKYO ELECTRON LIMITED, Tokyo (JP)

(72) Inventors: Shinji Wakabayashi, Nirasaki (JP); Keisuke Kondoh, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/252,978

(22) Filed: Jan. 21, 2019

(65) Prior Publication Data

US 2019/0152722 A1 May 23, 2019

Related U.S. Application Data

(63) Continuation of application No. PCT/JP2017/022866, filed on Jun. 21, 2017.

(30) Foreign Application Priority Data

Jul. 22, 2016 (JP) .................................. 2016-144764

(51) Int. Cl.
*B65G 49/07* (2006.01)
*H01L 21/67* (2006.01)
*H01L 21/677* (2006.01)

(52) U.S. Cl.
CPC ........ *B65G 49/07* (2013.01); *H01L 21/67161* (2013.01); *H01L 21/67173* (2013.01); *H01L 21/67178* (2013.01); *H01L 21/67201* (2013.01); *H01L 21/67775* (2013.01); *H01L 21/67778* (2013.01)

(58) Field of Classification Search
CPC ................... H01L 21/67173; H01L 21/67178
USPC .......................... 414/751.1, 409, 416.8, 422
See application file for complete search history.

(56) References Cited

U.S. PATENT DOCUMENTS

| 7,950,407 B2* | 5/2011 | Mimken | ........... H01L 21/67057 137/14 |
| 2012/0232690 A1* | 9/2012 | Gilchrist | ........... H01L 21/67742 700/228 |

FOREIGN PATENT DOCUMENTS

| JP | 2002-334918 A | 11/2002 |
| JP | 2003-188229 A | 7/2003 |
| JP | 2004-349503 A | 12/2004 |
| JP | 200828035 A | 2/2008 |
| JP | 2003-197709 A | 7/2008 |
| JP | 2014-68009 A | 4/2014 |
| WO | 01/75965 A1 | 10/2001 |

* cited by examiner

*Primary Examiner* — Ronald P Jarrett
(74) *Attorney, Agent, or Firm* — Nath, Goldberg & Meyer; Jerald L. Meyer

(57) ABSTRACT

Four groups of a three-tier arrangement of processing units, each of the processing units being provided with two processing modules and a load lock module, are provided in the front and rear sides along a Y-guide extending rearward when viewed from an EFEM and in the left and right sides of the Y-guide. An exchange of a substrate between a delivery mechanism on the EFEM side and a substrate transfer mechanism on the processing unit side is performed by a substrate loading part, which is movable along the Y-guide and can move upward and downward, and on which a plurality of wafers can be placed in a shelf-like manner.

12 Claims, 11 Drawing Sheets

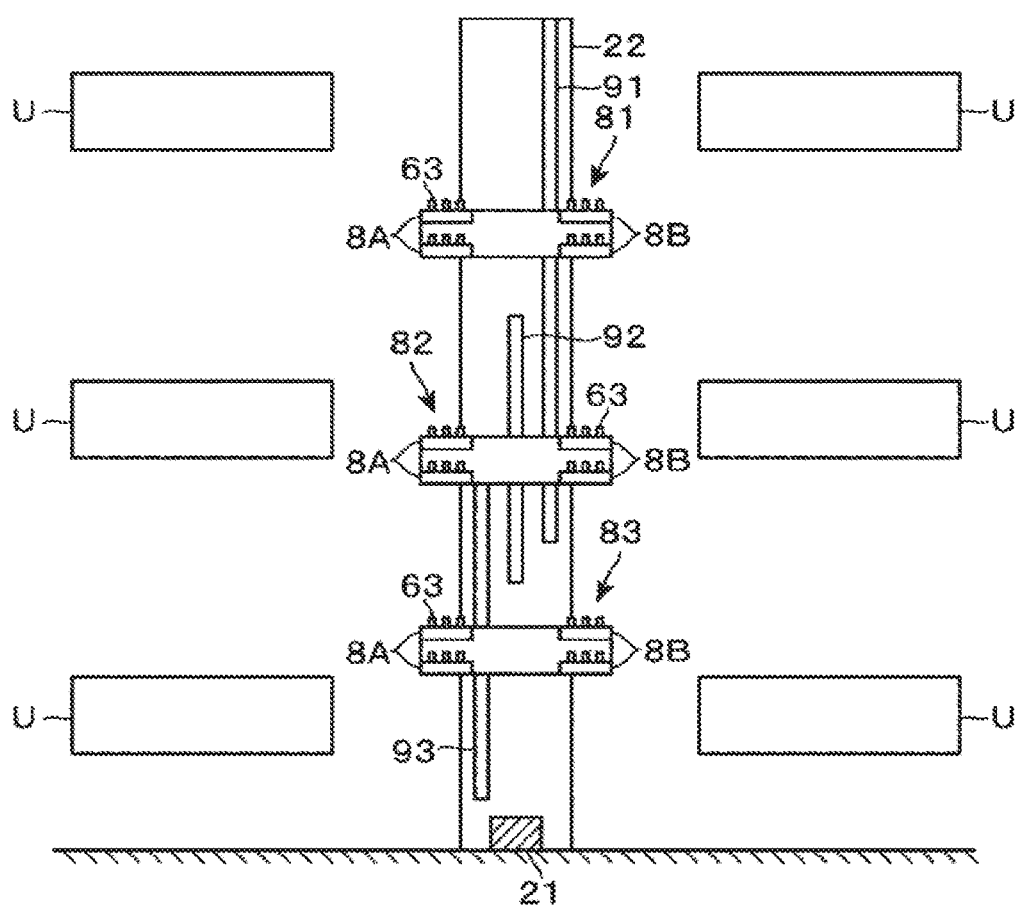

SUBSTRATE PROCESSING DEVICE

CROSS-REFERENCE TO RELATED APPLICATION

This application is a bypass continuation application of international application No. PCT/JP2017/022866 having an international filing date of Jun. 21, 2017 and designating the United States, the international application being based upon and claiming the benefit of priority from Japanese Patent Application No. 2016-144764, filed on Jul. 22, 2016, the entire contents of which are incorporated herein by reference.

TECHNICAL FIELD

The present disclosure relates to a substrate processing device including an equipment front end module (EFEM) for discharging a substrate from a transfer container of the substrate and a processing module for processing the substrate.

BACKGROUND

In a semiconductor manufacturing process, vacuum processing such as film formation, etching, ashing, annealing or the like is carried out on a semiconductor wafer (hereinafter, referred to as a "wafer"). In order to carry out the vacuum processing with high throughput, a vacuum processing system called a multi-chamber system or the like is known. In the multi-chamber system, a polygonal vacuum transfer chamber is connected to an EFEM via a load lock chamber, and a vacuum processing module is connected to one side of the vacuum transfer chamber.

Meanwhile, recently, a long process time may be required for the vacuum processing due to diversification of semiconductor devices. For example, in the case of forming a three-dimensional memory, for example, a NAND circuit, a considerably long process time is required for one film forming process in order to alternately deposit an oxide layer and a nitride layer plural times. Therefore, in order to increase the throughput, it is desired to establish a system capable of increasing the number of process chambers.

There is known a system including an equipment front end module (EFEM) for drawing out a wafer from a wafer carrier, a linear robot for moving the wafer along an elongated path, and two pairs of processing clusters installed on both sides of the linear robot to perform the vacuum processing. Each of the pairs of processing clusters includes a cluster robot that transfers the wafer between first and second process chambers and the linear robot. In addition, Patent Document 1 describes that the linear robot may operate at an atmospheric pressure and may be configured by a wafer shuttle.

There is also known a layout in which a plurality of devices for performing vacuum processing are arranged on both sides of a linear guide path for loading and transferring a wafer. These conventional techniques can increase the number of mounted process chambers, as compared to the multi chamber system, and thus are expected to contribute to improvement of the throughput. However, in order to cope with prolonging of the vacuum processing such as the film forming process for one wafer or the like, it is desirable to design a device that can further improve the throughput while suppressing a sharp rise in device cost.

SUMMARY

The present disclosure provides some embodiments of a technique capable of improving throughput while suppressing a sharp rise in device cost in processing a substrate.

According to one embodiment of the present disclosure, there is provided a substrate processing device including: an equipment front end module (EFEM) that includes a container loading part configured to load a transfer container accommodating a plurality of substrates and a delivery mechanism configured to transfer the substrates to and from the transfer container loaded on the container loading part; a moving part movably installed along a moving path linearly extending toward a rear side when viewed from the EFEM; multiple stages of processing units arranged in a vertical direction, the multiple stages of processing units facing the moving path in a plan view; and a substrate loading part installed in the moving part so as to move upward and downward via an elevating mechanism, and configured to load the plurality of substrates in a shelf shape. Each of the processing units includes a processing module configured to process the substrates and a substrate transfer mechanism configured to transfer the substrates between the processing module and the substrate loading part. The substrate loading part is configured to be movable between a position where the substrates are transferred by the delivery mechanism and a position where the substrates are transferred by the substrate transfer mechanism of each of the multiple stages of processing units.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 11 is a front view illustrating a portion of the substrate processing apparatus according to the fourth embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described with reference to detail so as not to unnecessarily obscure aspects of the various embodiments.

Figure 1:
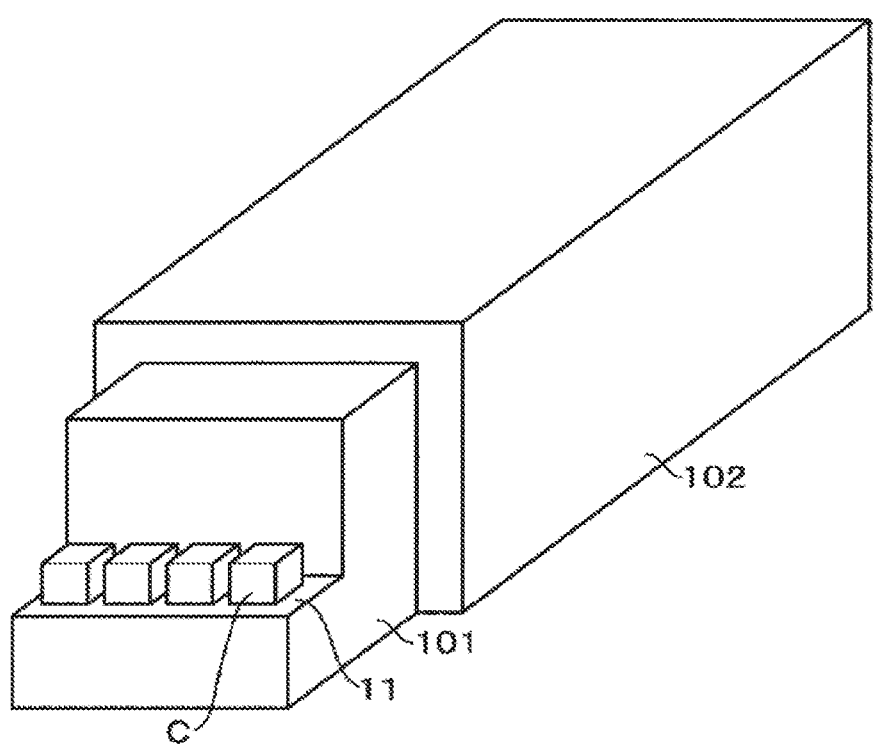
FIG. 1 is an external view illustrating a substrate processing apparatus according to a first embodiment of the present disclosure.

A substrate processing apparatus according to a first embodiment of the present disclosure will be described. As illustrated in an external view of FIG. 1, the substrate processing apparatus includes an EFEM 101 for discharging a wafer from a carrier C which is a transfer container that accommodates a plurality of wafers as substrates, and a processing block 102 connected to the EFEM 101 and configured to process the wafer.

Figure 2:
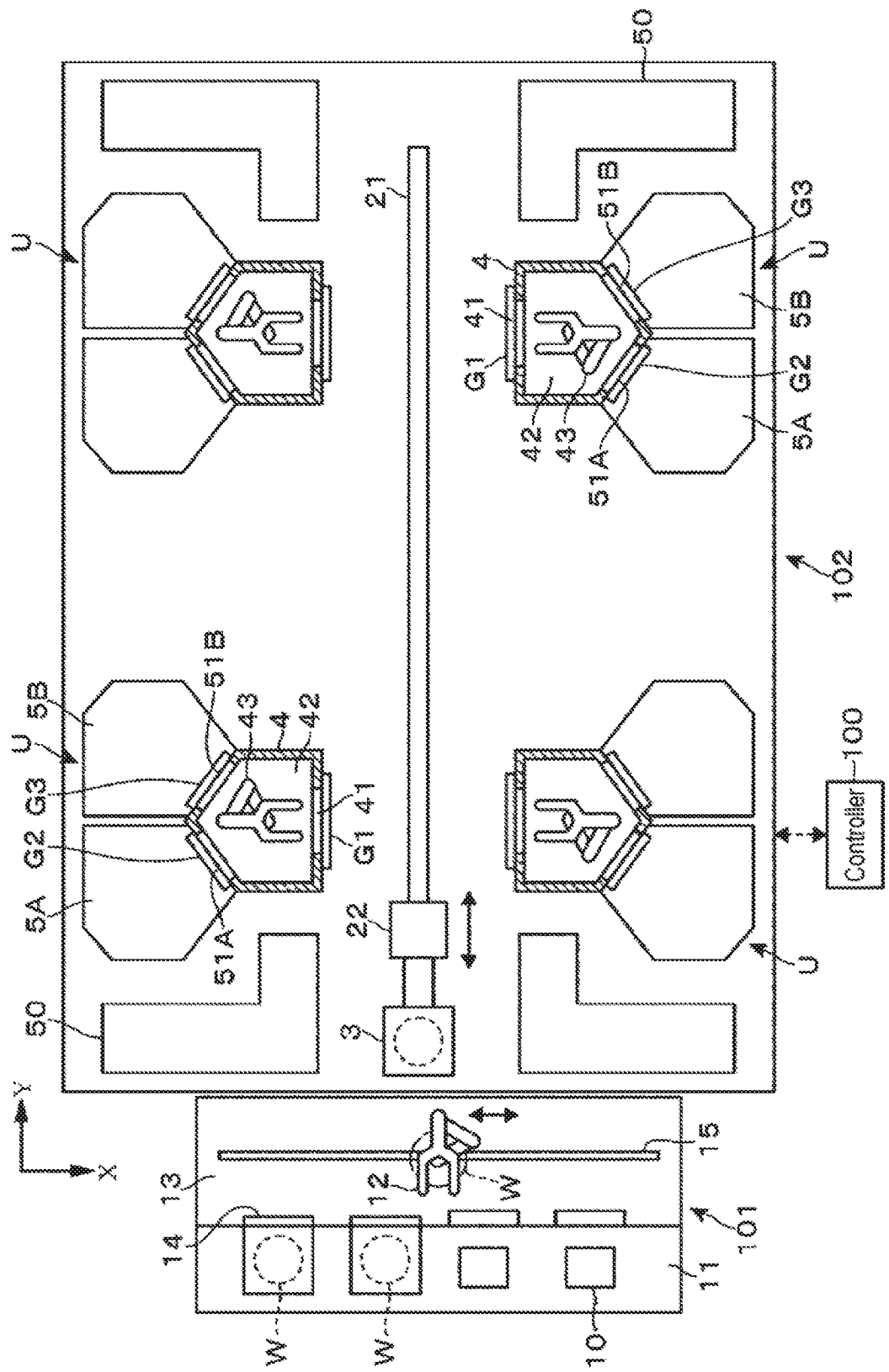
FIG. 2 is a plan view illustrating the substrate processing apparatus according to the first embodiment.

The EFEM 101 has a load port 11 which is a container loading part configured to load, for example, four carriers C that are for example FOUPs, in a lateral direction (X direction). In FIG. 2, a support part 10 for supporting a bottom portion of the carrier C in a state where a position of the carrier C is determined is illustrated. A transfer chamber 13 in which a delivery mechanism 12 for transferring a wafer to and from the carrier C is disposed is installed on a rear side of the load port 11. The transfer chamber 13 is set to a normal pressure atmosphere, for example, an air atmosphere. An opening/closing door 14 for opening and closing an opening which is a wafer discharge port is installed on a wall portion in the transfer chamber 13 that faces the carrier C.

The delivery mechanism 12 is configured such that an extensible articulated arm is installed on a base (not shown), which is movable along a guide 15 (see FIG. 2) extending in the X direction, so that the articulated arm can move upward and downward and rotate. A front cover of the carrier C is opened as the opening/closing door 14 is opened, and the wafer is discharged by the delivery mechanism 12.

Figure 3:
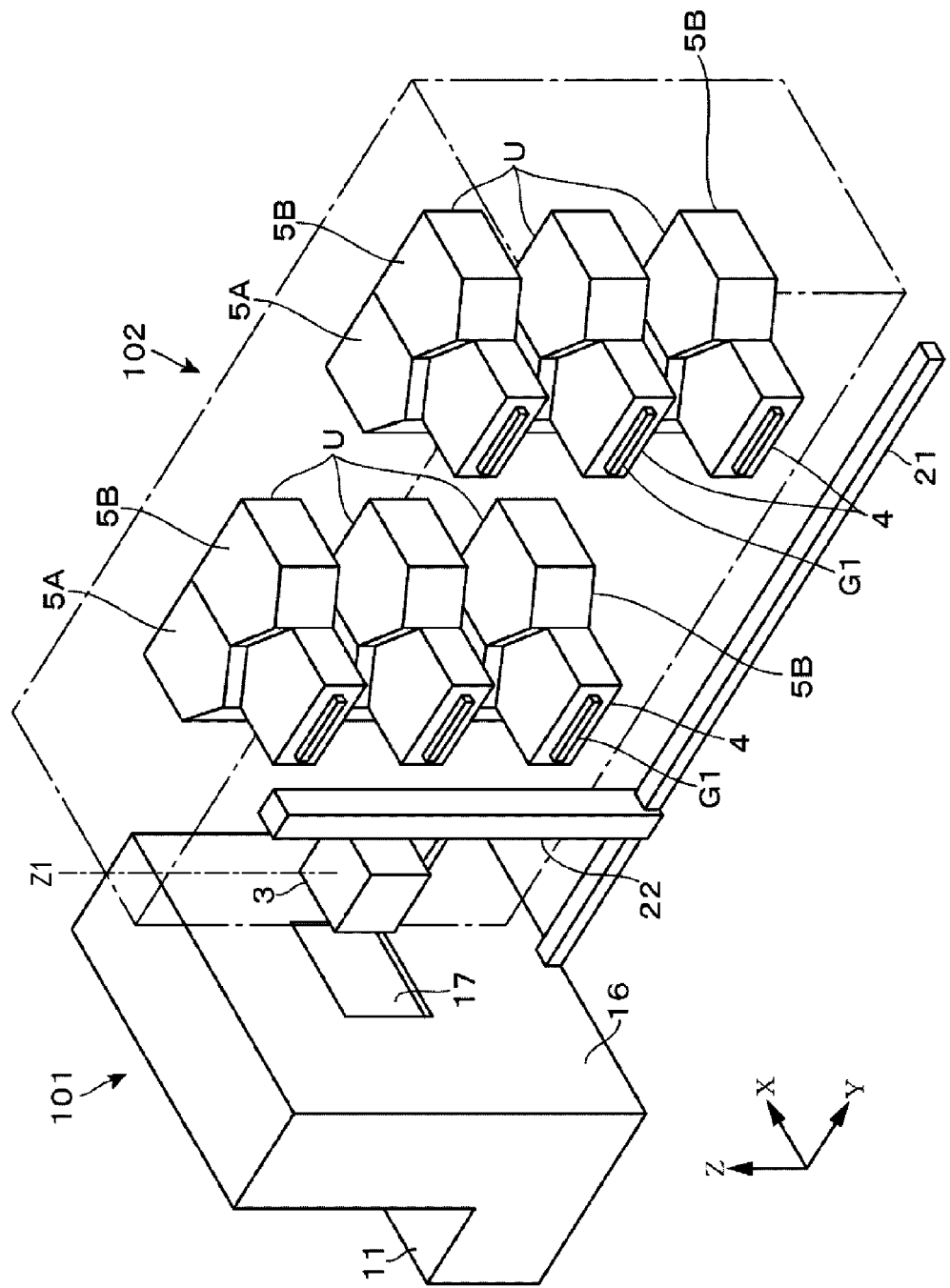
FIG. 3 is a perspective view illustrating an interior of the substrate processing apparatus according to the first embodiment.
Figure 4:
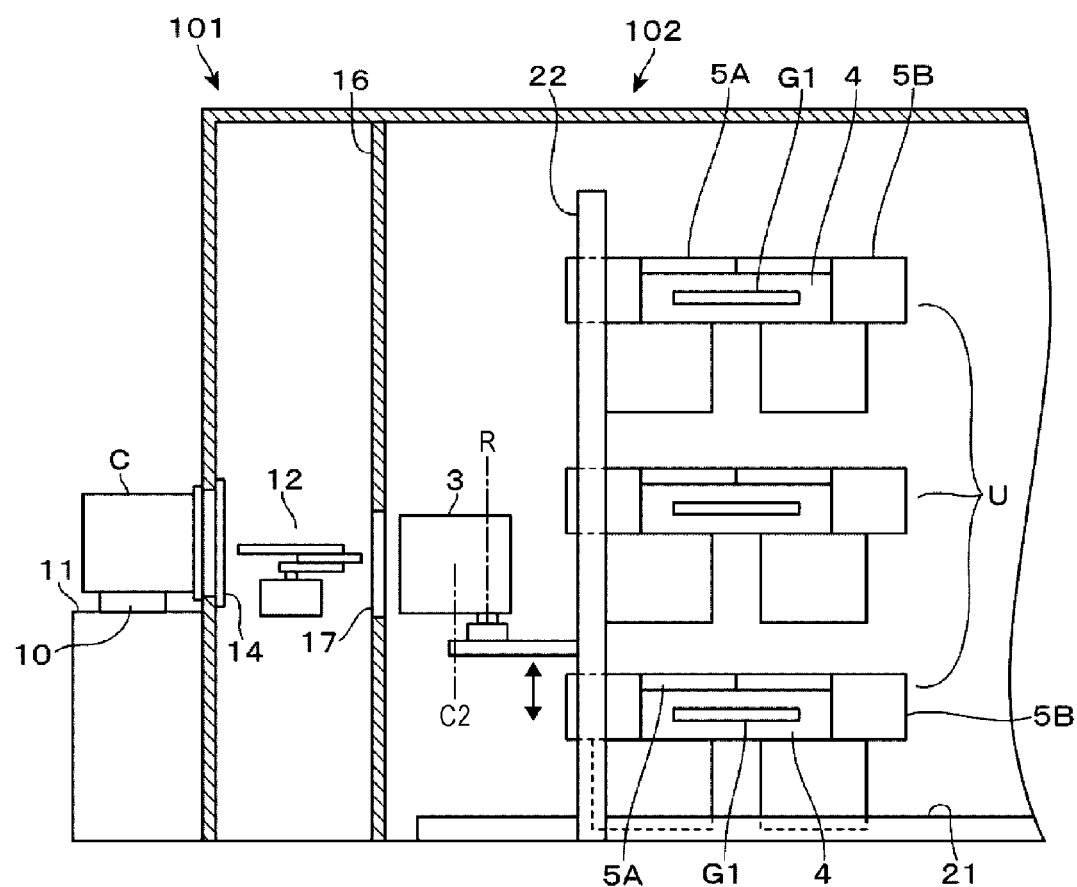
FIG. 4 is a side view illustrating the interior of the substrate processing apparatus according to the first embodiment.

As illustrated in FIGS. 3 and 4, an opening 17 as a transfer port through which the delivery mechanism 12 supporting the wafer W passes is formed on a wall portion 16 which is a rear surface with respect to the load port 11 in the transfer chamber 13. The opening 17 may be closed by a shutter (not shown) so as to partition the atmosphere of the EFEM 101 and the processing block 102 when the wafer W is not transferred (as will be described later) through the opening 17.

A Y guide 21 which is a moving path extending in the Y direction, namely a moving path linearly extending toward the rear side when viewed from the EFEM 101, is installed in the central portion in the X direction at the bottom of the processing block 102. In the processing block 102, a pillar part 22 forming a moving part which is guided by the Y guide 21 to be movable in the Y direction is installed, and a substrate loading part 3 that can move upward and downward along the pillar part 22 is installed on the EFEM 101 side of the pillar part 22. A region where the substrate loading part 3 moves is set to a normal pressure atmosphere, for example, an air atmosphere.

As a specific mechanism for moving the pillar part 22 in the Y direction, for example, a belt transfer mechanism or the like may be applied. The belt transfer mechanism is configured by installing a driving pulley driven by a driving source and a driven pulley at positions corresponding to both ends of the Y guide 21, respectively, hanging a belt between the driving pulley and the driven pulley, and fixing the pillar part 22 to the belt.

Before describing the substrate loading part 3, a structure of the processing block 102 will be described. On each of the left and right sides of the Y guide 21, a pair of groups of processing units U is arranged along the Y guide 21. Each of the groups of the processing units U includes processing units U arranged in, for example, three stages (i.e., three stages of processing units U) along the Y guide 21. In FIG. 3, only two groups longitudinally arranged on the left side of the Y guide 21 when viewed from the EFEM 101 are illustrated, and the left side portion excluding the moving region of the substrate loading part 3 in the processing block 102 is enclosed by a chain line for the sake of convenience.

Each of the processing units U of these two groups includes a load lock module 4, and a first processing module 5A and a second processing module 5B in which the wafer W is transferred to and from the substrate loading part 3 via the load lock module 4. Each processing unit U is configured to have the same structure, and is supported by a structure (not shown) including, for example, a pillar or the like, fixed to the bottom surface of the processing block 102.

The load lock module 4 includes a load lock chamber 42 having, for example, a pentagonal planar shape and having one side extending along the Y guide 21. A transfer port 41 for loading and unloading the wafer W is formed on a wall portion corresponding to the one side. Therefore, the transfer port 41 faces the moving region of the substrate loading part 3 described above. The transfer port 41 is opened and closed by a gate valve G1. A substrate transfer mechanism 43 configured by an articulated arm that is rotatable around a vertical axis is installed in the load lock chamber 42. Although not shown, an exhaust pipe for vacuum exhaust by a vacuum exhaust mechanism is connected to the load lock chamber 42 so that the atmosphere of the load lock chamber 42 can be switched between a normal pressure atmosphere, for example, an air atmosphere, and a vacuum atmosphere.

A vacuum process chamber of the first processing module 5A and a vacuum process chamber of the second processing module 5B are airtightly connected to two sides of the load lock chamber 42 on the rear side when viewed from the transfer port 41 via transfer ports 51A and 51B, respectively. The transfer ports 51A and 51B are respectively opened and closed by gate valves G2 and G3. In FIGS. 2 to 4, like processing modules and vacuum process chambers are denoted by like reference numerals, and therefore, no reference numeral is given to the vacuum process chambers.

The substrate transfer mechanism 43 transfers the wafer W among the substrate loading part 3, the first processing module 5A, and the second processing module 5B. Each of the first processing module 5A and the second processing module 5B are configured to perform, for example, a film forming process which is vacuum processing, and include a loading table of the wafer W, a processing gas supply part for the film forming process, a cleaning gas supply part for dry-cleaning the interior of the vacuum process chamber, an exhaust port for vacuum exhaust by the vacuum exhaust mechanism, and the like. A plasma generation mechanism may be also installed when plasma processing is performed. In FIG. 2, a portion denoted by reference numeral 50 on the side of each processing unit U indicates a device arrangement region where a gas supply device, a high frequency power supply for plasma generation, and the like are arranged. Since the structure of a film forming apparatus of the vacuum atmosphere is well known, the structure of the processing modules is not particularly shown.

Figure 5:
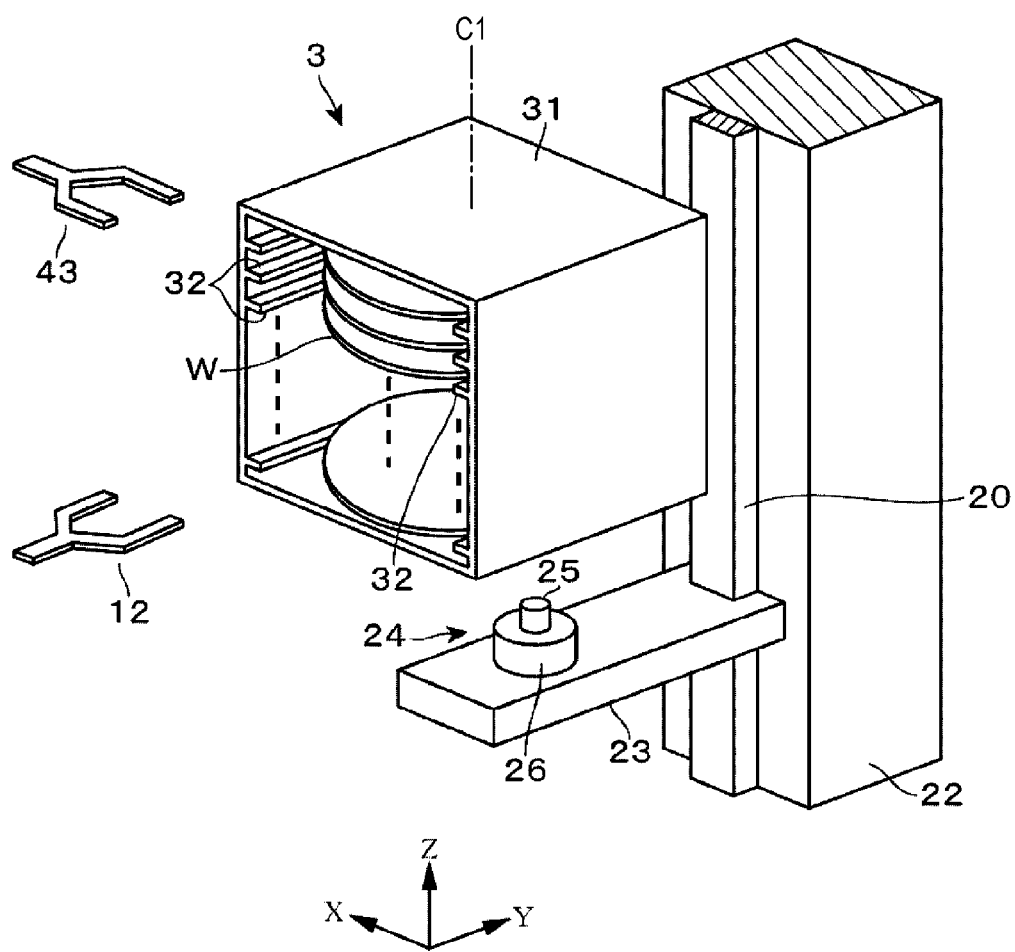
FIG. 5 is an exploded perspective view illustrating a substrate loading part used in the first embodiment.

Returning to the description of the substrate loading part 3, as illustrated in FIG. 5, the substrate loading part 3 is configured such that a plurality of sets of holding parts 32, each of which is formed of a protrusion longitudinally extending to hold the right and left peripheral portions of the wafer W, are vertically installed on both side surfaces inside a box body 31 having a front face being opened as a transfer port of the substrate. That is to say, a plurality of wafers W is held inside the box body 31 in a shelf shape.

The substrate loading part 3 is installed on an elevating table 23 that is a vertically movable elevating part installed on the pillar part 22, which is a moving part movable in the Y direction, via a rotary mechanism 24. Although FIG. 5 illustrates a Z guide 20 which is a guide path for guiding the elevating table 23 in a Z direction (vertical direction), specifically, a well-known belt transfer mechanism, a ball screw mechanism or the like may be used.

The rotary mechanism 24 includes a rotary shaft 25 rotatable around the vertical axis Z1 and a rotary driving part 26 for rotating the rotary shaft 25, and the bottom surface of the box body 31 is fixed to the top of the rotary shaft 25. Therefore, it can be considered that the substrate loading part 3 is configured to be freely movable in the Y direction, freely movable upward and downward, and rotatable around the vertical axis Z1.

The substrate loading part 3 serves to transfer the wafers W between the delivery mechanism 12 in the EFEM 101 and the substrate transfer mechanism 43 in the load lock module 4. Therefore, when the front face of the substrate loading part 3 faces the opening 17 on the rear surface of the EFEM 101, the wafers W are transferred by the delivery mechanism 12, and when the front face thereof faces the transfer port 41 of the load lock chamber 42, the wafers W are transferred by the substrate transfer mechanism 43.

The center of rotation of the substrate loading part 3 may be positioned at the center in the longitudinal and lateral directions of the substrate loading part 3, but in this example, the center R of rotation of the substrate loading part 3 is positioned at the center C1 of the substrate loading part 3 in the lateral direction and is displaced rearward from the center C2 in the longitudinal direction. Therefore, when viewed from the center in the lateral direction, the substrate loading part 3 is shifted to the left when the front face of the substrate loading part 3 faces left, and the substrate loading part 3 is shifted to the right when the front face thereof faces right. Thus, the advancing/retreating stroke of the substrate transfer mechanism 43 in the load lock module 4 may be shortened.

The wafers W received by the substrate loading part 3 from the delivery mechanism 12 of the EFEM 101 are unprocessed wafers W and the wafers W received from the substrate transfer mechanism 43 in the load lock module 4 are processed wafers W. The number of wafers W loaded in the substrate loading part 3 is determined depending on an operation mode taking into consideration a time required for vacuum processing performed by the processing module 5A or 5B, whether or not any one processing unit U is performing maintenance, or the like. Therefore, the number of stages of the holding parts 32 (storage capacity) in the substrate loading part 3 is determined according to a maximum loading number of sheets among loading numbers of sheets in association with operation modes that can be performed by a user.

Since the substrate transfer mechanism 43 needs to transfer the processed wafers W to the substrate loading part 3 prior to discharging the unprocessed wafers W from the substrate loading part 3, it is necessary to set the number of stages of the holding parts 32 to the number obtained by adding one to the number of the unprocessed wafers W transferred from the EFEM 101 side and loaded to the substrate loading part 3. For example, when the substrate loading part 3 receives twelve wafers W from the EFEM 101 side and distributes and transfers the same to each processing unit U, it is necessary to have an empty space for one sheet in the substrate loading part 3, namely to have thirteen stages of holding parts 32.

When the substrate transfer mechanism 43 has two substrate holding parts (picks), it is not necessary to have the empty space for one sheet, i.e., one stage of holding parts 32.

The operation mode will now be described. For each processing unit U, there may be an operation mode, for example, in which a film forming process is performed on the wafers W in one of the first processing module 5A and the second processing module 5B while a cleaning process is performed in the other one of the first processing module 5A and the second processing module 5B. Such an operation mode may be applied to a case where a long process time is required for the film forming process, for example, a case where a step of forming a silicon oxide film using a monosilane ($SiH_4$) gas and a nitrogen dioxide ($NO_2$) gas and a step of forming a silicon nitride film using a $SiH_4$ gas and an ammonia ($NH_3$) gas are repeated plural times. More specifically, while a processing of depositing half the target number of thin films is performed on the wafers W in one of the first processing module 5A and the second processing module 5B, a cleaning process is performed in the other one of the first processing module 5A and the second processing module 5B, and then, while a processing of depositing the remaining half the target number of thin films is performed in the other one of the first processing module 5A and the second processing module 5B, a cleaning process is performed in the one of the first processing module 5A and the second processing module 5B.

In this example, if the film forming process is performed simultaneously by four groups of processing units U (where one group has three stages), the number of unprocessed wafers W received by the substrate loading part 3 from the delivery mechanism 12 of the EFEM 101 becomes, for example, twelve sheets. If the film forming process is performed simultaneously by two groups of processing units U facing each other via the Y guide 21, among the four groups of processing units U, the number of wafers W received by the substrate loading part 3 from the EFEM 101 side becomes, for example, six sheets.

The operation mode is not limited to the above-described example, but may be applied to a case where the film forming process is performed by using both the first processing module 5A and the second processing module 5B of each processing unit U. In this case, the number of wafers W received by the substrate loading part 3 from the EFEM 101 side may be, for example, twenty-four sheets, corresponding to the four groups of processing units U, or may be twelve sheets which are half of the twenty-four sheets.

That is to say, the number of unprocessed wafers W received by the substrate loading part 3 from the EFEM 101 side can be set according to the time required for the film forming process, the operation mode, or the like, so that the highest throughput can be achieved. In this respect, the substrate loading part 3 used in the present embodiment has a structure superior to transfer by a transfer arm or a well-known wafer shuttle.

Returning to FIG. 2, the substrate processing apparatus according to the present embodiment includes a controller 100 configured as a computer that has a storage part (not shown) storing a software necessary for operation. The software includes a process recipe for specifying sequences and parameter values for executing a process performed on the wafers W, a program including a group of steps constituting a transfer sequence of the wafers W, a program linked with the process recipe for determining an appropriate number of unprocessed wafers W to be carried into the substrate loading part 3, and the like. This software is stored in the storage part through a storage medium such as, e.g., a solid state drive (SSD), a hard disk, a compact disc, a magneto optical disc, or a memory card.

Next, an operation of the aforementioned embodiment will be described. As a process performed in the processing unit U, an example in which a silicon oxide film and a silicon nitride film are alternately deposited using one of the first processing module 5A and the second processing module 5B while cleaning is performed in the other one of the first processing module 5A and the second processing module 5B will be described. Description will be made for a case where the process is simultaneously performed in the processing units U, which are arranged on the front side and facing each other via the Y guide 21 when viewed from the EFEM 101, and at a timing delayed from the start time of the processes at the front side by a predetermined time, the process is simultaneously performed in the processing units U arranged on the rear side.

First, the four carriers C are carried into the load port 11 of the EFEM 101 and the opening/closing door 14 is opened to discharge the wafer W from the carrier C by the delivery mechanism 12. The front face of the substrate loading part 3 stands by at a position facing the opening 17 on the rear surface of the EFEM 101, and the wafer W supported by the delivery mechanism 12 is transferred to the substrate loading part 3 through the opening 17. In transferring the wafer W between the delivery mechanism 12 and the substrate loading part 3, the height position of the wafer W is controlled such that the height of the delivery mechanism 12 is adjusted while the height position of the substrate loading part 3 is fixed, for example.

For example, when six (unprocessed) wafers W are loaded to the substrate loading part 3 in a state in which an empty space for a wafer W is left at an upper end side of the substrate loading part 3, the pillar part 22 is moved to a position corresponding to the processing unit U on the front side when viewed from the EFEM 101, and the substrate loading part 3 is raised to a height position corresponding to the uppermost stage of processing unit U. Then, the substrate loading part 3 rotates to, for example, the left side, so that the front face of the substrate loading part 3 faces the transfer port 41 of the load lock chamber 42 of the processing unit U on the left side of the Y guide 21.

On the other hand, in the processing unit U on the front side, the wafers W that have been already processed are transferred from, for example, the second processing module 5B into the load lock chamber 42, by the transfer mechanism 43, and the interior of the load lock chamber 42 is in a normal pressure atmosphere.

Figure 6A:
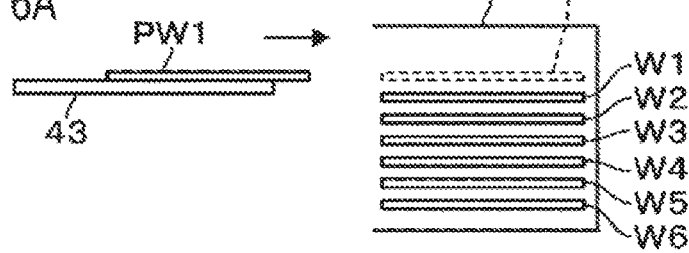
FIGS. 6A to 6D are explanatory views illustrating a transfer state of wafers in the substrate loading part in the first embodiment.
Figure 6B:
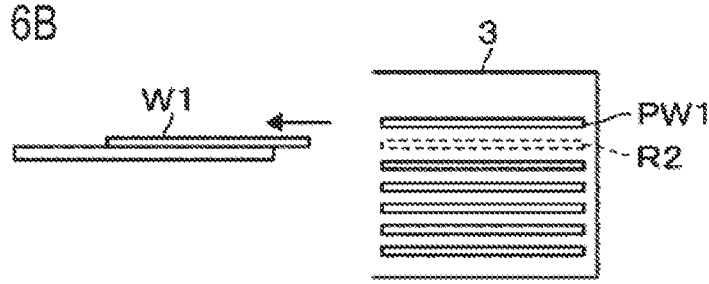

The subsequent wafer transfer will be described with reference to FIGS. 6A to 6D. Wafers W1 to W6 in FIGS. 6A to 6D indicate unprocessed wafers. The gate valve G1 of the load lock chamber 42 is opened and a processed wafer PW1 is first transferred by the substrate transfer mechanism 43 to an empty region R1 above the region where the wafers W1 to W6 are supported by the substrate loading part 3 (FIG. 6A). Subsequently, the substrate transfer mechanism 43 is retracted, and then the substrate loading part 3 is raised so that the height position of the wafer W1 at the uppermost stage among the six unprocessed wafers W1 to W6 in the substrate loading part 3 corresponds to an access position of the substrate transfer mechanism 43, and the wafer W1 at the uppermost stage is carried into the load lock chamber 42 by the substrate transfer mechanism 43 (FIG. 6B). In FIG. 6B, the empty region after the wafer W1 is extracted is indicated by R2.

Figure 6C:
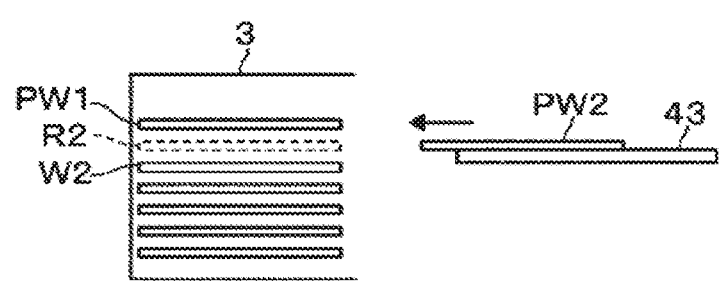
Figure 6D:
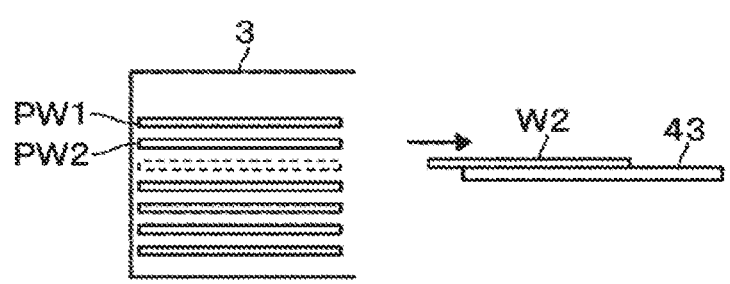

Thereafter, the substrate loading part 3 rotates to, for example, the right side, so that the front face of the substrate loading part 3 faces the transfer port 41 of the load lock chamber 42 of the uppermost stage of processing unit U at the right side of the Y guide 21, and the gate valve G1 of the load lock chamber 42 of the processing unit U is opened. Next, a processed wafer PW2 is transferred to the aforementioned empty region R2 of the substrate loading part 3 by the substrate transfer mechanism 43 (FIG. 6C). Subsequently, the substrate transfer mechanism 43 is retracted, and then the substrate loading part 3 is raised so that the height position of the wafer W2, which is arranged at one stage below the wafer W1 already extracted from the substrate loading part 3, corresponds to the access position of the substrate transfer mechanism 43, and the wafer W2 is carried into the load lock chamber 42 by the substrate transfer mechanism 43 (FIG. 6D).

Thereafter, the substrate loading part 3 rotates to, for example, the left side, and is lowered to a height position corresponding to the second stage of processing unit U so that the processed wafer W in the processing unit U is transferred into the substrate loading part 3 and the unprocessed wafer W3 in the substrate loading part 3 is carried into the processing unit U. In this manner, the unprocessed wafers W1 to W6 of the substrate loading part 3 are transferred to three stages of the front side processing units U arranged at the left and the right sides, and the processed wafers W are received from these processing units U. Next, the front face of the substrate loading part 3 is returned to a position facing the opening 17 on the rear surface of the EFEM 101, and the processed wafers W in the substrate loading part 3 are sequentially discharged through the opening 17 by the delivery mechanism 12, and are returned to, for example, the original carrier C.

On the other hand, the wafers W carried into the load lock chamber 42 are first transferred to the first processing module 5A to be subjected to alternate film formation of, for example, a silicon oxide film and a silicon nitride film, a predetermined number of times. For example, when counting both of the films as one deposition layer, depositing half the target number of deposition layers is performed, while a cleaning process is performed in the second processing module 5B. The cleaning process is performed by, for example, a nitrogen trifluoride ($NF_3$) gas, so as to remove the thin films (the silicon oxide film and the silicon nitride film) adhered to the interior of the vacuum process container. When the film forming process of depositing half the target number of deposition layers on the wafer W is completed in the first processing module 5A, the wafer W is transferred to the second processing module 5B so that the film forming process on the remaining number of deposition layers is performed in the second processing module 5B. When the series of film forming processes are completed, the wafer W is carried into the load lock chamber 42 and is transferred to the substrate loading part 3 as described above. Then, a subsequent unprocessed wafer W is transferred to the first processing module 5A and the film forming process is performed in the same manner.

The unprocessed wafers W are similarly transferred to the left and right processing units U on the rear side among the four processing units U. In this case, the start time of film formation in the left and right processing units U on the front side and the start time of film formation in the left and right processing units U on the rear side are deviated by a predetermined time. After the processed wafers W received by the substrate loading part 3 from the left and right processing units U on the front side are transferred to the EFEM 101, the unprocessed wafers W to be processed by the left and right processing units U on the rear side are received from the EFEM 101 so that the processed wafers W and the unprocessed wafers W are exchanged between the substrate loading part 3 and the left and right processing units U on the rear side. The aforementioned deviation of the start times is set such that the processed wafers W in any of the front side processing units U and the rear side processing units U do not wait unnecessarily in such a series of operations.

Furthermore, the sequence including the series of position controls of the substrate loading part 3 is executed by the program stored in the controller 100 and constituting the transfer sequence.

According to the aforementioned embodiment, four groups, in each of which the processing units U including the two processing modules 5A and 5B and the load lock module 4 are arranged in three stages, are installed longitudinally along the Y guide 21 extending rearward when viewed from the EFEM 101, with the Y guide 21 interposed between two groups on the left side and two groups on the right side. Then, in one movement of the substrate loading part 3 between the EFEM 101 and the processing units U, unprocessed wafers W corresponding to the number of processed wafers W are loaded on the substrate loading part 3, and are then transferred and distributed to the processing units U, and all the processed wafers W are received by the substrate loading part 3 and then are transferred to the EFEM 101. Thus, it is possible to obtain high throughput (increase in the number of processed sheets per unit time), and to establish a substrate processing apparatus with high processing capability.

Furthermore, since the transfer of the wafers W between the delivery mechanism 12 on the EFEM 101 side and the substrate transfer mechanism 43 on the processing units U side is taken over by the substrate loading part 3, it is possible to reduce the cost and suppress dust generation as compared to the case of using a transfer arm. There is also known a method of directly performing transfer of wafers W between the transfer arms, but such a method has a problem that a shape of picks holding the wafers W becomes complicated, making it difficult to control the transfer. Furthermore, in the case of using the transfer arm instead of the substrate loading part 3, when the transfer between the delivery mechanism 12 in the EFEM 101 and the transfer arm is performed via a transfer stage (buffer stage), the number of times of transfer is increased, which leads to a reduction in throughput and becomes disadvantageous from the viewpoint of freedom of design. On the other hand, when the substrate loading part 3 is used as in the aforementioned embodiment, such a problem is solved.

The substrate loading part 3 is not limited to the structure of the aforementioned embodiment and may be any structure, as long as a plurality of wafers W can be loaded in a shelf shape and the wafers W can be transferred by the delivery mechanism 12 of the EFEM 101 and the substrate transfer mechanism 43 of the processing unit U.

Figure 7:
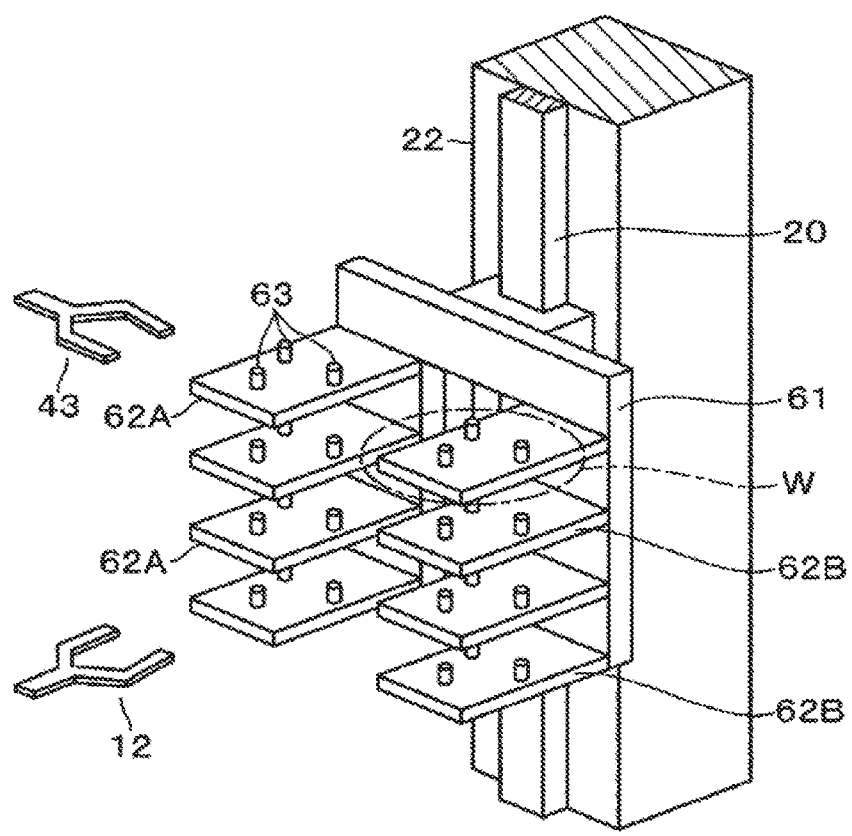
FIG. 7 is a perspective view illustrating a substrate loading part used in a substrate processing apparatus according to a second embodiment of the present disclosure.
Figure 8:
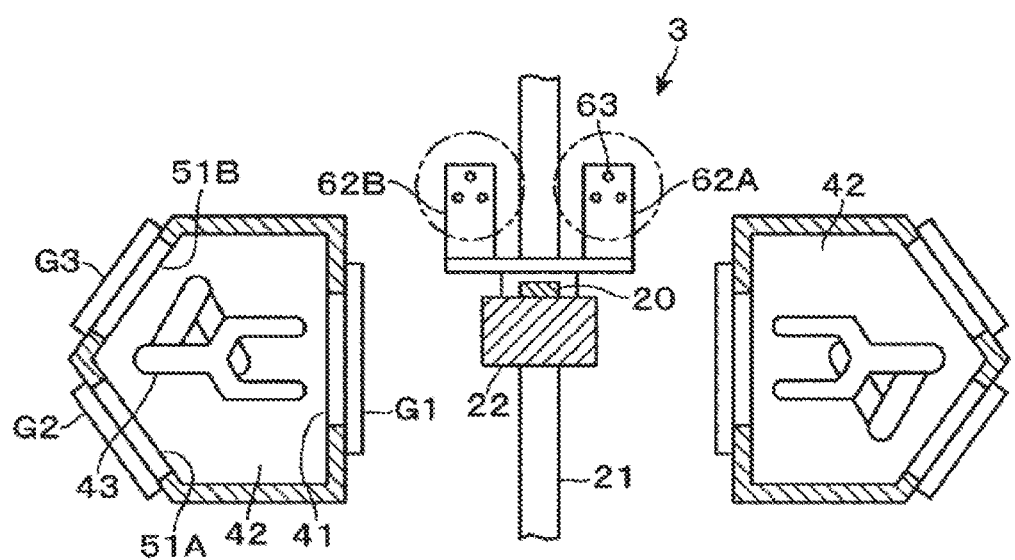
FIG. 8 is a plan view illustrating a portion of the substrate processing apparatus according to the second embodiment.

FIGS. 7 and 8 illustrate the substrate loading part 3 used in a substrate processing apparatus according to a second embodiment of the present disclosure. A plate-like elevating base 61, which is guided by the Z guide 20 installed on a front side of the pillar part 22 to move upward and downward, is installed in the substrate loading part 3. The elevating base 61 has vertically long portions on the left and right sides connected by horizontally long portions. For example, four stages of loading tables 62A and 62B are installed in the left and right vertically long portions of the elevating base 61 so as to horizontally protrude toward the front side, namely toward the EFEM 101 side.

Three holding pins 63, which are protrusions for holding the wafers W, are installed on the upper surface of each of the loading tables 62A and 62B. The height and the arrangement layout of the three holding pins 63 are set such that the substrate holding parts (picks) of the delivery mechanism 12 and the substrate transfer mechanism 43 can enter between the upper surfaces of the loading tables 62A and 62B and the wafers W and without interfering the holding pins 63 in plane. The four stages of loading tables 62A on the left side are for transferring the substrates to and from the substrate transfer mechanism 43 of the load lock module 4 on the left side and the four stages of loading tables 62B on the right side are for transferring the substrates to and from the substrate transfer mechanism 43 of the load lock module 4 on the right side.

The components other than the substrate loading part 3 are similar to those of the first embodiment. In the second embodiment, in addition to the up-down movement operation, the delivery mechanism 12 of the EFEM 101 is also moved in the lateral direction, whereby the unprocessed wafers W are transferred to the loading tables 62A and 62B of the substrate loading part 3. As described with reference to the first embodiment, the uppermost stage of the loading tables 62A and 62B remain empty spaces without loading the wafers W. After the unprocessed wafers are transferred to the second to fourth stages of the loading tables 62A and 62B, the pillar part 22 is moved to a position corresponding to the processing units U on the front side and the substrate loading part 3 is raised to a height position corresponding to the uppermost stage of the processing units U.

In the first embodiment, the substrate loading part 3 sequentially rotates to the left side and to the right side to transfer the wafers W to and from the left processing unit U and the right processing unit U. However, in the second embodiment, the wafers W are transferred to and from the processing units U without rotating the substrate loading part 3. That is to say, by the substrate transfer mechanism 43 in the load lock chamber 42 of the uppermost stage of processing unit U on the left side, the processed wafer W is transferred from the load lock chamber 42 to the uppermost stage of the loading table 62A on the left side of the substrate loading part 3, and the unprocessed wafer W on the second stage of loading table 62A is carried into the load lock chamber 42.

At this time, the wafers W are similarly transferred between the substrate transfer mechanism 43 in the load lock chamber 42 of the uppermost stage of the processing unit U on the right side and the loading table 62B on the right side of the substrate loading part 3. For example, the left and right substrate transfer mechanisms 43 simultaneously perform the transfer operation of the wafers W to the left and right loading tables 62A and 62B, respectively.

Next, the elevating base 61 moves upward to a position corresponding to the second stage of the processing unit U. Then, the wafers W are similarly transferred to the left and right loading tables 62A and 62B by the substrate transfer mechanism 43 in the load lock chamber 42 of the second stage of the processing unit U on the left side and the substrate transfer mechanism 43 in the load lock chamber 42 of the second stage of the processing unit U on the right side, respectively. The same transfer is also performed between the third stage of the processing unit U and the substrate loading part 3, and the substrate loading part 3 is returned to a position facing the opening 17 on the rear surface of the EFEM 101 in a state in which the processed wafers W are loaded on each of the left and right loading tables 62A and 62B.

Each of the left and right loading tables 62A and 62B is arranged in four stages, but this configuration is merely an example. For example, it may be configured such that each of the left and right loading tables 62A and 62B is arranged in seven stages so that six unprocessed wafers W to be transferred to each of the processing units U longitudinally arranged on the left side are loaded on the left loading table 62A and six unprocessed wafers W to be transferred to each of the processing units U longitudinally arranged on the right side are mounted on the right loading table 62B.

When the substrate loading part 3 is configured such that a plurality of stages of loading tables 62A and 62B are respectively installed on the left and right sides of the substrate loading part 3 as in the second embodiment, even if the rotary mechanism is not used as in the first embodiment, there is an advantage that the substrate transfer mechanism 43 in the load lock chamber 42 can transfer the wafers W with a short stroke.

Figure 9:
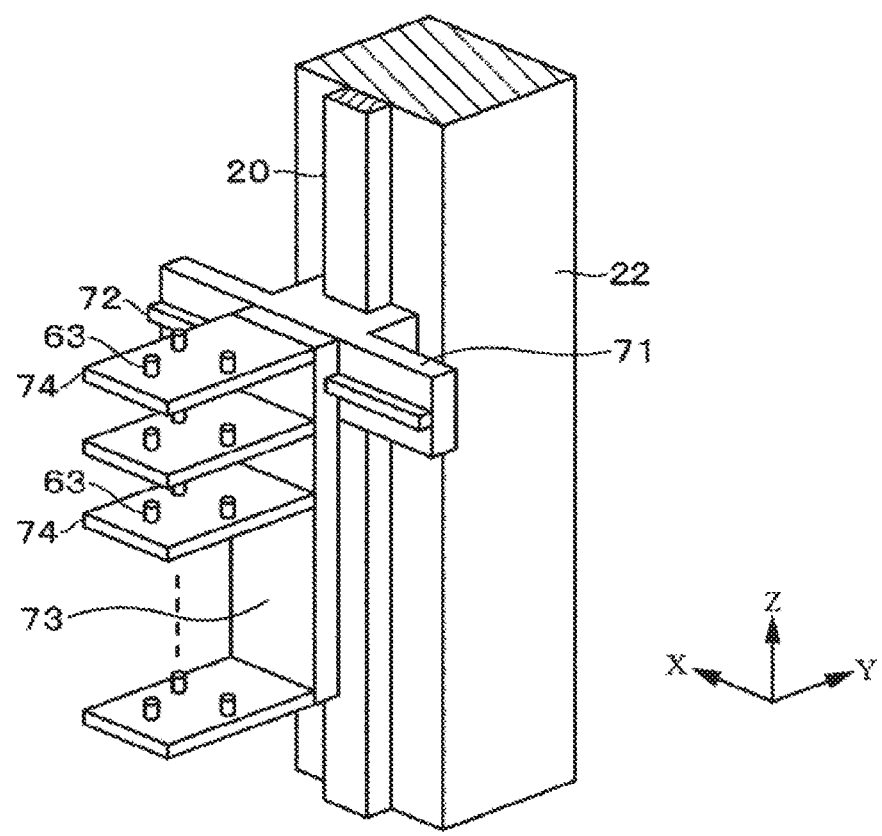
FIG. 9 is a perspective view illustrating a substrate loading part used in a substrate processing apparatus according to a third embodiment of the present disclosure.

FIG. 9 illustrates a substrate loading part 3 used in a substrate processing apparatus according to a third embodiment of the present disclosure. A horizontally long elevating base 71, which is guided by the Z guide 20 installed on the front side of the pillar part 22 so as to move upward and downward, is installed in the substrate loading part 3. In the elevating base 71, an X guide 72 extending in the X direction is installed, and a vertically long X moving body 73 which is guided by the X guide 72 so as to move in the X direction is installed. Examples of a moving mechanism for moving the X moving body 73 may include a belt transfer mechanism, a ball screw mechanism, and the like.

Loading tables 74 having the same structure as the loading table 62A (62B) used in the second embodiment are installed in, for example, seven stages, in the X moving body 73.

In this example, among the seventh stages of the loading tables 74, for example, the uppermost stage of the loading table 74 remains as an empty space and a total of six unprocessed wafers W are loaded on the second and subsequent stages of the loading tables 74 by the delivery mechanism 12. Then, the pillar part 22 is moved to a position corresponding to the processing units U on the front side, and the substrate loading part 3 is raised to a position corresponding to the uppermost stage of the processing unit U by the elevating base 71.

Then, the X moving body 73 is positioned to be biased to the left side, and the processed wafer W is transferred to the uppermost stage of the loading table 74 and the unprocessed wafer W on the second stage of the loading table 74 is transferred to the substrate transfer mechanism 43 by the substrate transfer mechanism 43 of the load lock chamber 42, as described in detail above. Next, the elevating base 71 moves upward by one stage of the loading table 74 and the X moving body 73 is positioned to be biased to the right side, and the processed wafer W are transferred from the uppermost stage of the processing unit U on the right side to the second stage of the loading table 74. By sequentially moving the X moving body 73 in the lateral direction and setting the height position of the elevating base 71 to a position corresponding to each processing unit U in this way, the processed wafers W and the unprocessed wafers W are transferred (exchanged) between the substrate loading part 3 and the left and right processing units U on the front side. In other words, in this example, the positions where the X moving body 73 is biased to the left side and the right side correspond to the positions of the loading tables 62A and 62B of the second embodiment, respectively.

Also in this example, the stroke of the substrate transfer mechanism 43 may be short. The vertically long member constituting the X moving body 73 may be fixed to the middle position between the left and right processing units U. This configuration may be adopted when the stroke of the substrate transfer mechanism 43 can cope with this configuration.

Figure 10:
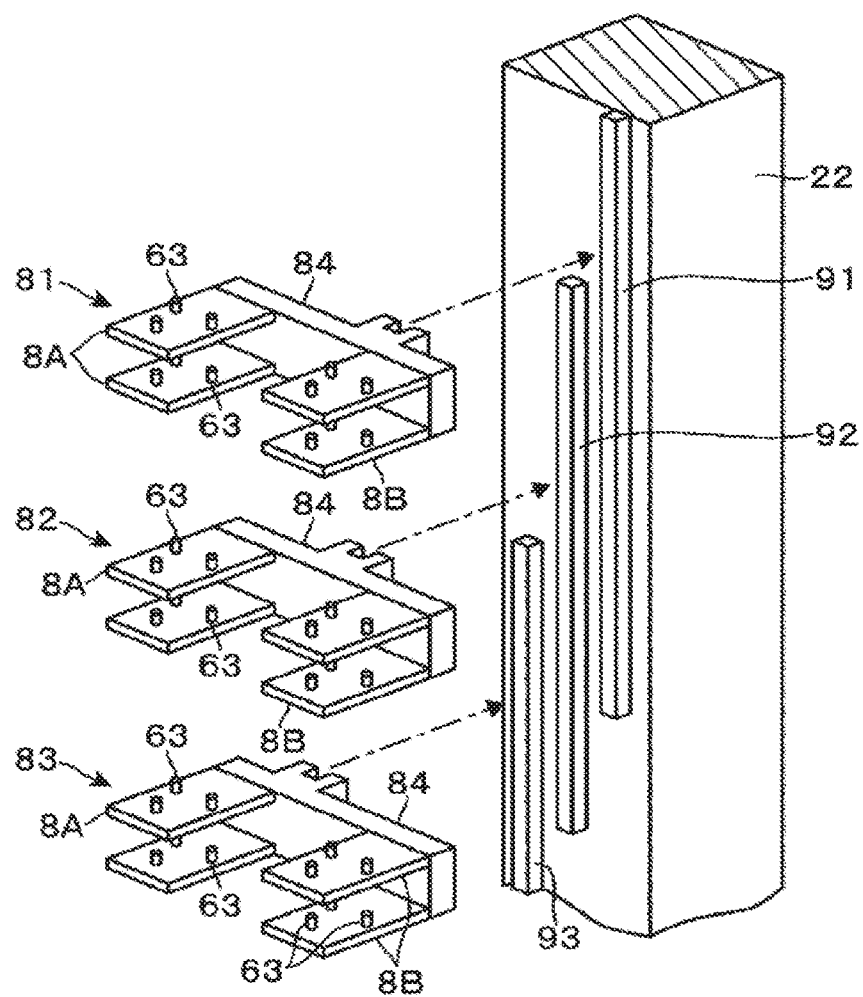
FIG. 10 is a perspective view illustrating a substrate loading part used in a substrate processing apparatus according to a fourth embodiment of the present disclosure.

FIGS. 10 and 11 illustrate a substrate loading part 3 used in a substrate processing apparatus according to a fourth embodiment of the present disclosure. The substrate loading part 3 includes a first loading table unit 81 for transferring the substrates to and from the uppermost stage of the processing units U among three stages of the processing units U, and a second loading table unit 82 for transferring the substrates to and from a second stage of the processing units U, and a third loading table unit 83 for transferring the substrates to and from a third stage of the processing units U.

The first to third loading table units 81 to 83 can independently move upward and downward within upward and downward movement ranges so that the first to third loading table units 81 to 83 can transfer the wafers W to the first to third stages of the processing units U, respectively, and can transfer the wafers W to and from the delivery mechanism 12 of the EFEM 101. In order to allocate the upper and lower movement ranges, first to third Z guides 91 to 93, which are guide paths for respectively guiding the first to third loading table units 81 to 83 to move upward and downward, are installed in the pillar part 22. Each of the first to third loading table units 81 to 83 includes, for example, a horizontally long elevating base 84, and each elevating base 84 is guided by the first to third Z guides 91 to 93 to move upward and downward. Although roughly illustrated in FIG. 10, as a mechanism for moving upward and downward the first to third loading table units 81 to 83, a belt transfer mechanism, a ball screw mechanism, or the like may be used.

In each elevating base 84, two stages of loading tables 8A are installed on the left side and two stages of loading tables 8B are installed on the right side. Positions of the two stages of loading tables 8A on the left side in the lateral direction and positions of the two stages of loading tables 8B on the right side in the lateral direction respectively correspond to the positions of the loading tables 62A on the left side and the loading tables 62B on the right side in the second embodiment. That is to say, the wafers W are transferred between the two stages of loading tables 8A on the left side and the processing unit U on the left side, and are transferred between the two stages of loading tables 8B on the right side and the processing unit U on the right side.

Therefore, in the sets of the two stages of loading tables 8A on the left side of the first to third loading table units 81 to 83, the wafers W are transferred to and from the respective processing units U of the upper, middle, and lower stages in the processing units U on the left side. Further, in the sets of the two stages of loading tables 8B on the right side of the first to third loading table units 81 to 83, the wafers W are transferred to and from the respective processing units U of the upper, middle, and lower stages in the processing units U on the right side. The upper stage and the lower stage of the two stages of loading tables 8A or 8B forming one set are for loading the unprocessed wafers W and the processed wafers W, respectively.

In the fourth embodiment, the unprocessed wafers W are transferred to, for example, the lower stages of the two stages of the loading tables 8A on the left side in the first to third loading table units 81 to 83 and, for example, the lower stages of the two stages of the loading tables 8B on the right side, by the delivery mechanism 12. Then, the first to third loading table units 81 to 83 are set to height positions corresponding to, for example, the front side processing units U of the upper, middle, and lower stages, respectively, and the processed wafers W and the unprocessed wafers W are simultaneously transferred with respect to the left side processing units U of the upper, middle, and lower stages and the right side processing units U of the upper, middle, and lower stages.

Therefore, the fourth embodiment is an effective method in terms of improving the throughput. Furthermore, in the fourth embodiment, the first to third loading table units 81 to 83 are not limited to have the sets of two stages of loading tables 8A and 8B in the left side and the right side, respectively, but the sets of two stages of loading tables may be installed in the central portion between the left side and the right side processing units U facing each other in the lateral direction. In this case, the transfer of the wafers W to one of the left side and the right side processing units U is completed in the substrate loading part 3 (the first to the third loading table units 81 to 83), and after being returned to the transfer position of the wafers W to the EFEM 101 once, the transfer of the wafers W to and from the other one of the left side and the right side processing units U is subsequently performed.

In the aforementioned embodiments, the processing units U are arranged in three stages respectively on the left and right sides, but the processing units U may be arranged in two or four or more stages. In addition, the processing units U are not limited to two groups longitudinally arranged along the Y guide 21 but may be arranged in three groups or only in one group. Furthermore, the processing unit U may be arranged only on one side of the Y guide 21.

The vacuum processing in the processing modules 5A and 5B is not limited to the film forming process, but may be an annealing process, an etching process, or the like. The same vacuum processing may be performed on the wafers W in parallel in the first and second processing modules 5A and 5B. Alternatively, different processes may be consecutively performed in the first and second processing modules 5A and 5B.

In addition, one or three or more processing modules may be installed in each processing unit. Furthermore, the processing performed in the processing modules is not limited to the vacuum processing, but may be, for example, a wet cleaning processing for adsorbing a wafer W to a spin chuck in an air atmosphere and supplying a cleaning liquid. In this case, no load lock module is required. The substrate is not limited to the wafer but may be a glass substrate used for a liquid crystal panel or the like.

According to the present disclosure, in a substrate processing device including an EFEM and a processing module for processing a substrate, processing units including a processing module and a substrate transfer mechanism are arranged in multiple stages so as to face a moving path extending to a rear side when viewed from the EFEM. Further, a substrate loading part capable of accommodating a plurality of substrates in a shelf shape is installed so as to move along the moving path and move upward and downward, and serves to transfer between a substrate delivery mechanism on the EFEM side and the substrate transfer mechanism on the processing unit side. Therefore, it is possible to obtain high throughput, and to suppress a sharp rise in cost for the mechanism for transfer.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing device, comprising:
   an equipment front end module (EFEM) that includes a load port configured to load a transfer container accommodating a plurality of substrates and a first articulated arm configured to transfer the substrates to and from the transfer container loaded on the load port;
   a pillar movably installed along a moving path linearly extending toward a rear side when viewed from the EFEM;
   a plurality of processing chambers facing the moving path in a plan view, each of the plurality of processing chambers being arranged directly above or below another processing chambers of the plurality of processing chambers in a direction of the plan view; and
   a substrate loading shelf installed in the pillar so as to move upward and downward via an elevating table, and configured to hold the plurality of substrates vertically inside a box body in a shelf shape,
   wherein each of the plurality of processing chambers includes a process chamber configured to process the substrates and a second articulated arm configured to transfer the substrates between the process chamber and the substrate loading shelf, and
   wherein the substrate loading shelf is configured to be movable between a position where the substrates are transferred by the first articulated arm and a position where the substrates are transferred by the second articulated arm of each of the plurality of processing chambers.

2. The device of claim 1, wherein multiple sets of two or more of the plurality of processing chambers are installed along the moving path.

3. The device of claim 1, wherein multiple sets of two or more of the plurality of processing chambers are installed on both sides of the moving path.

4. The device of claim 1, wherein the substrate loading shelf includes a plurality of sets of protrusions arranged at vertical intervals, each of the sets of protrusions including protrusions installed on left and right sides of the substrate loading shelf so as to hold left and right peripheral portions of each of the plurality of substrates, respectively, and is configured to rotate around a vertical axis so that a longitudinal direction of the substrate loading shelf is aligned with an advancing and retreating direction of the first articulated arm and an advancing and retreating direction of the second articulated arm, respectively.

5. The device of claim 4, wherein a center of rotation of the substrate loading shelf is a first center of the substrate loading shelf in a lateral direction and is displaced rearward from a second center of the substrate loading shelf in the longitudinal direction.

6. The device of claim 1, wherein the substrate loading shelf includes multiple stages of loading tables configured so as to allow a substrate transfer from any one of an advancing and retreating direction of the first articulated arm and an advancing and retreating direction of the second articulated arm.

7. The device of claim 6, wherein multiple sets of two or more of the plurality of processing chambers are installed on both left and right sides of the moving path, and
wherein the multiple stages of loading tables are installed side by side on the left and right sides of the moving path in a plane view, so that the substrate transfer with respect to each of the second articulated arm of the plurality of processing chambers installed on one of the left and right sides of the moving path is performed in the multiple stages of loading tables installed on one of the left and right sides of the moving path, and the substrate transfer with respect to each of the second articulated arm of the plurality of processing chambers installed on the other one of the left and right sides of the moving path is performed in the multiple stages of loading tables installed on the other one of the left and right sides of the moving path.

8. The device of claim 6, wherein multiple sets of two or more of the plurality of processing chambers are installed on both left and right sides of the moving path, and
wherein the multiple stages of loading tables are installed to be movable in a lateral direction between one position where the substrate transfer is performed with respect to each of the second articulated arm of the plurality of processing chambers installed on one of the left and right sides of the moving path and the other position where the substrate transfer is performed with respect to each of the second articulated arm of the plurality of processing chambers installed on the other one of the left and right sides of the moving path.

9. The device of claim 6, wherein sets of the multiple stages of loading tables are installed for respective processing chambers of the plurality of processing chambers, each of the sets of the multiple stages of loading tables including one loading table configured to load a processed substrate on the one loading table and the other loading table configured to load a processed substrate on the other loading table, the one loading table and the other loading table being arranged in the vertical direction and moving upward and downward integrally, and
wherein the sets of the multiple stages of loading tables corresponding to the respective processing chambers of the plurality of processing chambers are configured to move upward and downward independently from one another.

10. The device of claim 9, wherein multiple sets of two or more of the plurality of processing chambers are installed on both left and right sides of the moving path, and
wherein the sets of the multiple stages of loading tables include first sets of the multiple stages of loading tables installed to correspond to respective processing chambers of the multiple sets of two or more of the plurality of processing chambers installed on one of the left and right side of the moving path and second sets of the multiple stages of loading tables installed to correspond to respective processing chambers of the multiple sets of processing chambers installed on the other one of the left and right sides of the moving path, the first sets of the multiple stages of loading tables and the second sets of the multiple stages of loading tables being installed side by side on the left and right sides of the moving path in a plan view.

11. The device of claim 1, wherein each of the plurality of processing chambers includes a first process chamber and a second process chamber arranged side by side.

12. The device of claim 1, wherein each of the plurality of processing chambers includes a load lock chamber in which the second articulated arm is disposed, and a vacuum process chamber configured to perform vacuum processing.

* * * * *